US012555712B2

(12) United States Patent
Sano et al.

(10) Patent No.: US 12,555,712 B2
(45) Date of Patent: Feb. 17, 2026

(54) INDUCTOR COMPONENT

(71) Applicant: Murata Manufacturing Co., Ltd., Kyoto (JP)

(72) Inventors: Rikiya Sano, Nagaokakyo (JP); Tomonori Sakata, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 920 days.

(21) Appl. No.: 16/460,528

(22) Filed: Jul. 2, 2019

(65) Prior Publication Data

US 2020/0027637 A1 Jan. 23, 2020

(30) Foreign Application Priority Data

Jul. 20, 2018 (JP) ................................ 2018-136898

(51) Int. Cl.
*H01F 17/00* (2006.01)
*H01F 27/28* (2006.01)
(Continued)

(52) U.S. Cl.
CPC ..... *H01F 17/0013* (2013.01); *H01F 17/0033* (2013.01); *H01F 27/2804* (2013.01);
(Continued)

(58) Field of Classification Search
CPC ......... H01F 17/0013; H01F 2027/2809; H01F 17/0006; H01F 27/2804; H01F 5/003;
(Continued)

(56) References Cited

U.S. PATENT DOCUMENTS 6,132,843 A * 10/2000 Kuroda ............... C03C 23/0025 428/141
10,781,132 B2 9/2020 Umemoto et al.
(Continued)

FOREIGN PATENT DOCUMENTS

JP 2004128004 A * 4/2004
JP 2007027351 A * 2/2007
(Continued)

OTHER PUBLICATIONS

An Office Action; "Notice of Reasons for Refusal," mailed by the Japanese Patent Office on Feb. 2, 2021, which corresponds to Japanese Patent Application No. 2018-136898 and is related to U.S. Appl. No. 16/460,528 with English language translation.

*Primary Examiner* — Tszfung J Chan
(74) *Attorney, Agent, or Firm* — Studebaker Brackett PLLC

(57) ABSTRACT

An inductor component comprising an element body formed by laminating a plurality of insulating layers, and a helically wound coil disposed in the element body. The insulating layer contains a base material and a crystal, wherein a refractive index of each of the base material and the crystal is 1.8 or less for at least one wavelength of 350 nm or more and 450 nm or less (i.e., from 350 nm to 450 nm). The coil includes a coil wiring wound along a plane, and the coil wiring is made up of one coil conductor layer or a plurality of coil conductor layers laminated in surface contact with each other. Also, the aspect ratio of the coil conductor layer is 1.0 or more.

18 Claims, 13 Drawing Sheets

(51) Int. Cl.
*H01F 27/29* (2006.01)
*H01F 27/32* (2006.01)
*H01F 41/04* (2006.01)
*H05K 3/12* (2006.01)

(52) U.S. Cl.
CPC ........... *H01F 27/292* (2013.01); *H01F 27/32* (2013.01); *H01F 41/041* (2013.01); *H05K 3/12* (2013.01); *H01F 2017/004* (2013.01); *H01F 2027/2809* (2013.01)

(58) Field of Classification Search
CPC ........ H01F 27/29; H01F 27/292; H01F 27/32; H01F 17/0033; H01F 2017/004; H01F 41/041; H05K 3/12
USPC .................................................... 336/200, 232
See application file for complete search history.

(56) References Cited

U.S. PATENT DOCUMENTS

2008/0100408 A1* 5/2008 Chen .................. H01L 23/5227 336/200
2013/0308127 A1* 11/2013 Bisht .................... G01N 21/658 356/301
2015/0235745 A1* 8/2015 Choe ......................... H01F 1/26 106/31.92
2016/0086720 A1* 3/2016 Jeong .................... H01F 27/292 336/200
2016/0155556 A1* 6/2016 Ohkubo ................ H01F 27/292 336/83
2016/0163444 A1* 6/2016 Choi ..................... H01F 41/043 336/200
2016/0343500 A1* 11/2016 Jung ..................... H01F 41/042
2016/0363856 A1* 12/2016 Yagi .......................... G03F 1/20
2018/0090266 A1* 3/2018 Sano ..................... H01F 27/292
2018/0230040 A1* 8/2018 Umemoto ............. C03C 14/004

FOREIGN PATENT DOCUMENTS

JP 2011114173 A * 6/2011
JP 2013098356 A * 5/2013
JP 2014-107513 A 6/2014
JP 6260731 B1 1/2018
JP 2018-050015 A 3/2018
KR 20090064660 A * 6/2009

* cited by examiner

INDUCTOR COMPONENT

CROSS REFERENCE TO RELATED APPLICATION

This application claims benefit of priority to Japanese Patent Application 2018-136898 filed Jul. 20, 2018, the entire content of which is incorporated herein by reference.

BACKGROUND

Technical Field

The present disclosure relates to an inductor component.

Background Art

A conventional inductor component is described in Japanese Laid-Open Patent Publication No. 2014-107513. This inductor component has a component main body including a mounting surface and an external electrode formed on the mounting surface. The component main body has an element body made up of a plurality of insulating layers and a coil disposed in the element body and wound into a helical shape.

The coil is made up of coil wirings formed on the insulating layers and via wirings penetrating the insulating layers and electrically connecting a plurality of the coil wirings in series. The axis of the coil is substantially parallel to the mounting surface. The via wirings are formed only on the side farthest from the mounting surface.

As a result, the distance between the external electrode and the via wirings can be made larger to reduce a stray capacitance between the external electrode and a coil conductor so as to achieve an improvement in Q characteristics.

SUMMARY

However, the conventional inductor component is still insufficiently improved in the Q value and has room for improvement particularly in improvement in the Q value at higher frequencies.

Therefore, the present disclosure provides an inductor component capable of improving the Q value.

An aspect of the present disclosure provides an inductor component comprising an element body formed by laminating a plurality of insulating layers, and a helically wound coil disposed in the element body. The insulating layer contains a base material and a crystal, wherein a refractive index of each of the base material and the crystal is 1.8 or less for at least one wavelength of 350 nm or more and 450 nm or less (i.e., from 350 nm to 450 nm). The coil includes a coil wiring wound along a plane, and the coil wiring is made up of one coil conductor layer or a plurality of coil conductor layers laminated in surface contact with each other. Also, the aspect ratio of the coil conductor layer is 1.0 or more.

For example, the base material is an amorphous inorganic material or an amorphous organic material. The aspect ratio of the coil conductor layer is (the thickness of the coil conductor layer in the coil axial direction)/(the width of the coil conductor layer). The axial direction of the coil refers to a direction parallel to the central axis of the helix formed by winding the coil. The width of the coil conductor layer refers to a width in a direction orthogonal to the axial direction of the coil in a cross section orthogonal to the extending direction of the coil conductor layer.

According to the inductor component of the present disclosure, the Q value can be increased. In an embodiment of the inductor component, the aspect ratio of the coil conductor layer is 1.0 or more and less than 2.0 (i.e., from 1.0 to 2.0).

According to the embodiment, the Q value can be increased. In an embodiment of the inductor component, the coil wiring is made up of a plurality of coil conductor layers laminated in surface contact with each other.

According to the embodiment, it is possible to form a coil wiring with a high aspect ratio and a high rectangularity can be formed. In an embodiment of the inductor component, the aspect ratio of the coil wiring is 1.0 or more and less than 8.0 (i.e., from 1.0 to 8.0).

According to the embodiment, the Q value can be increased. In an embodiment of the inductor component, the aspect ratio of the coil wiring is 1.5 or more and less than 6.0 (i.e., from 1.5 to 6.0).

According to the embodiment, the Q value can be increased. In an embodiment of the inductor component, the width of the coil wiring is 20 μm or more.

According to the embodiment, the high aspect wiring can stably be formed. In an embodiment of the inductor component, a cross section of the coil conductor layer is T-shaped, and a cross section of the coil wiring has a stacked shape of T.

According to the embodiment, the coil wiring with a high aspect ratio can stably be formed. In an embodiment of the inductor component, a proportion of a difference between the maximum width and the minimum width of the coil wiring to the maximum width of the coil wiring is 20% or less.

According to the embodiment, the Q value can be increased. In an embodiment of the inductor component, the coil conductor layer is made up of a body portion and a head portion having a width greater than the width of the body portion, and a proportion of a difference between the maximum width and the minimum width of the body portion to the maximum width of the body portion is 10% or less.

According to the embodiment, the Q value can be increased. In an embodiment of the inductor component, the base material contains Si and is amorphous.

In an embodiment of the inductor component, the crystal is quartz. According to the embodiment, the refractive index of the crystal can be reduced.

In an embodiment of the inductor component, the base material is an amorphous glass containing B, Si, O, and K as main components. According to the embodiment, an element body having sufficient mechanical strength and insulation reliability can be obtained.

In an embodiment of the inductor component, in a cross section of the element body, an area ratio between the base material and the crystal is in a range of 75:25 to 50:50. According to the embodiment, an element body having sufficient densification and mechanical strength can be obtained.

In an embodiment of the inductor component, the element body includes a mark layer on the outside of the insulating layer in a lamination direction, and the mark layer contains an intra-mark-layer base material that contains Si and that is amorphous and an intra-mark-layer crystal. The mark layer contains a metal oxide, the refractive index of the metal oxide is 1.7 or more and 3.0 or less (i.e., from 1.7 to 3.0) for at least one wavelength of 450 nm or more and 750 nm or less (i.e., from 450 nm to 750 nm), the absorption coefficient of the metal oxide is 0.3 or more for at least one wavelength of 250 nm or more and 350 nm or less (i.e., from 250 nm to 350 nm). The refractive index of the intra-mark-layer base material is 1.4 or more and 1.6 or less (i.e., from 1.4 to 1.6) for at least one wavelength of 450 nm or more and 750 nm or less (i.e., from 450 nm to 750 nm).

According to the embodiment, the Q value can be increased. In an embodiment of the inductor component, the metal oxide contained in the intra-mark-layer crystal contains Ti, Nb, and Ce.

According to the embodiment, desired light absorption characteristics can be obtained. In an embodiment of the inductor component, the intra-mark-layer crystal contains a pigment.

According to the embodiment, the mark layer can be provided with visibility (distinguishability), and a detectability of an overturning failure can be improved in a mounting machine etc. In an embodiment of the inductor component, the intra-mark-layer crystal contains a metal oxide having a spinel type crystal structure containing Co.

According to the embodiment, the mark layer can be provided with visibility (distinguishability), and a detectability of an overturning failure can be improved in a mounting machine etc.

According to the inductor component of the present disclosure, the Q value can be increased.

DETAILED DESCRIPTION

A form of the present disclosure will now be described in detail with shown embodiments.

First Embodiment

Figure 1:
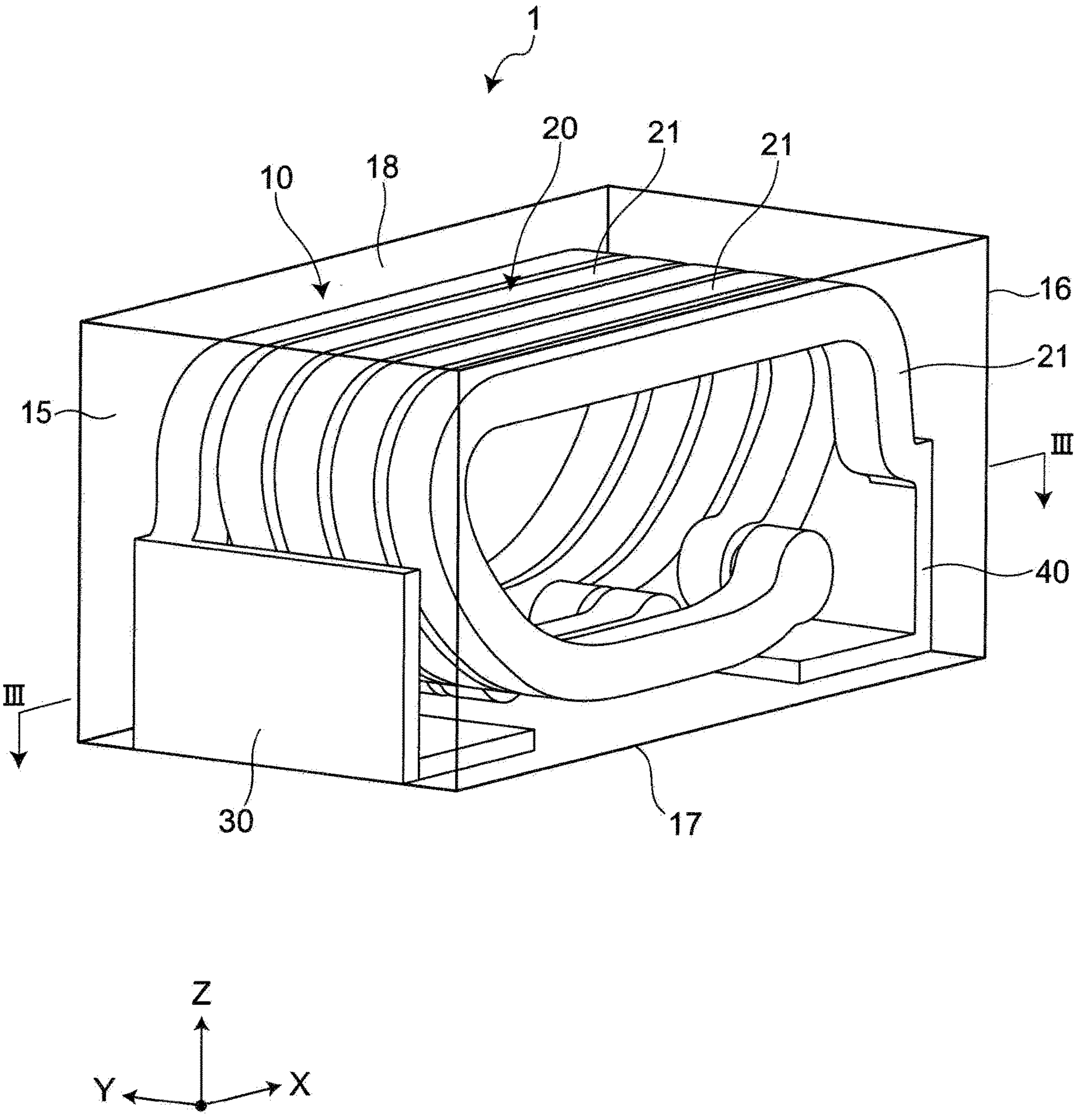
FIG. 1 is a transparent perspective view showing a first embodiment of an inductor component of the present disclosure.
Figure 2:
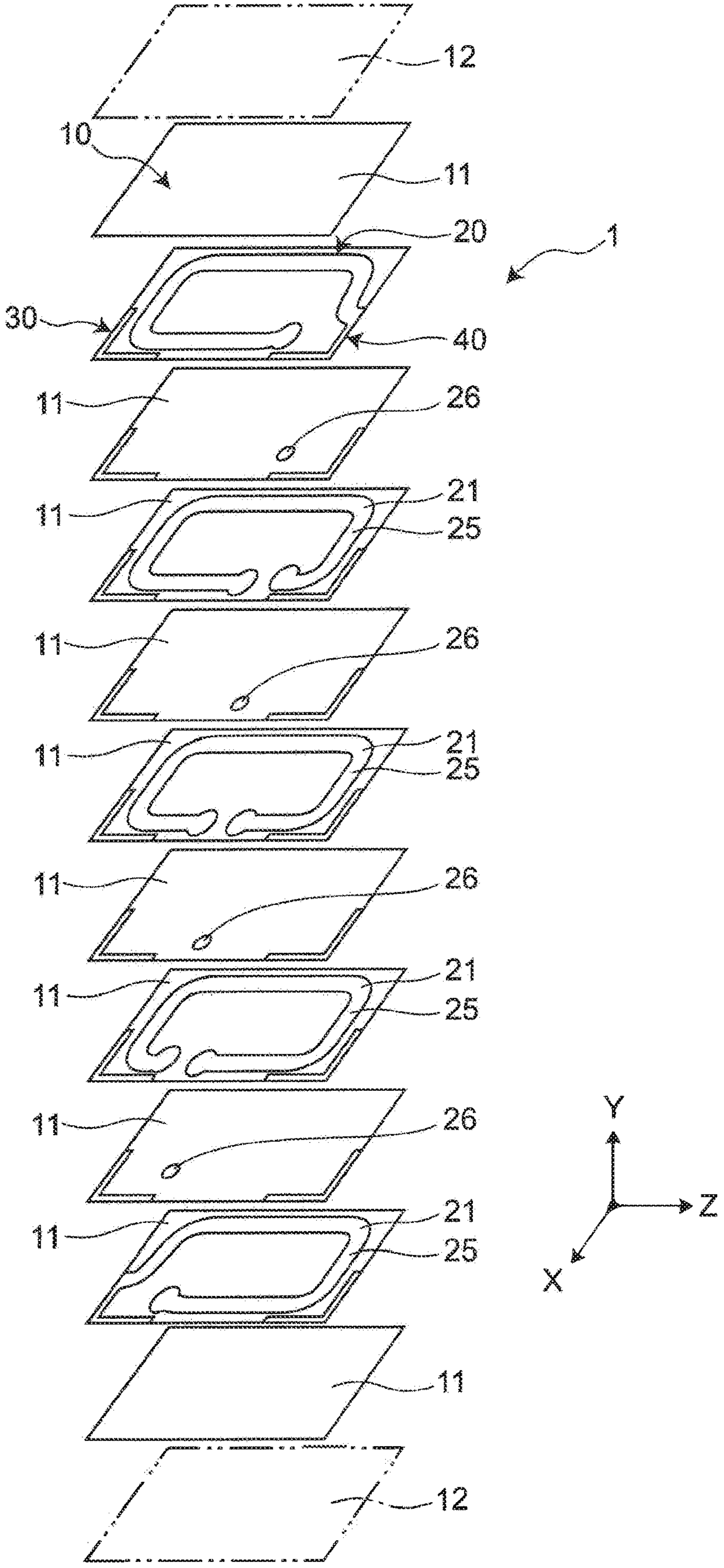
FIG. 2 is an exploded perspective view of the inductor component.
Figure 3:
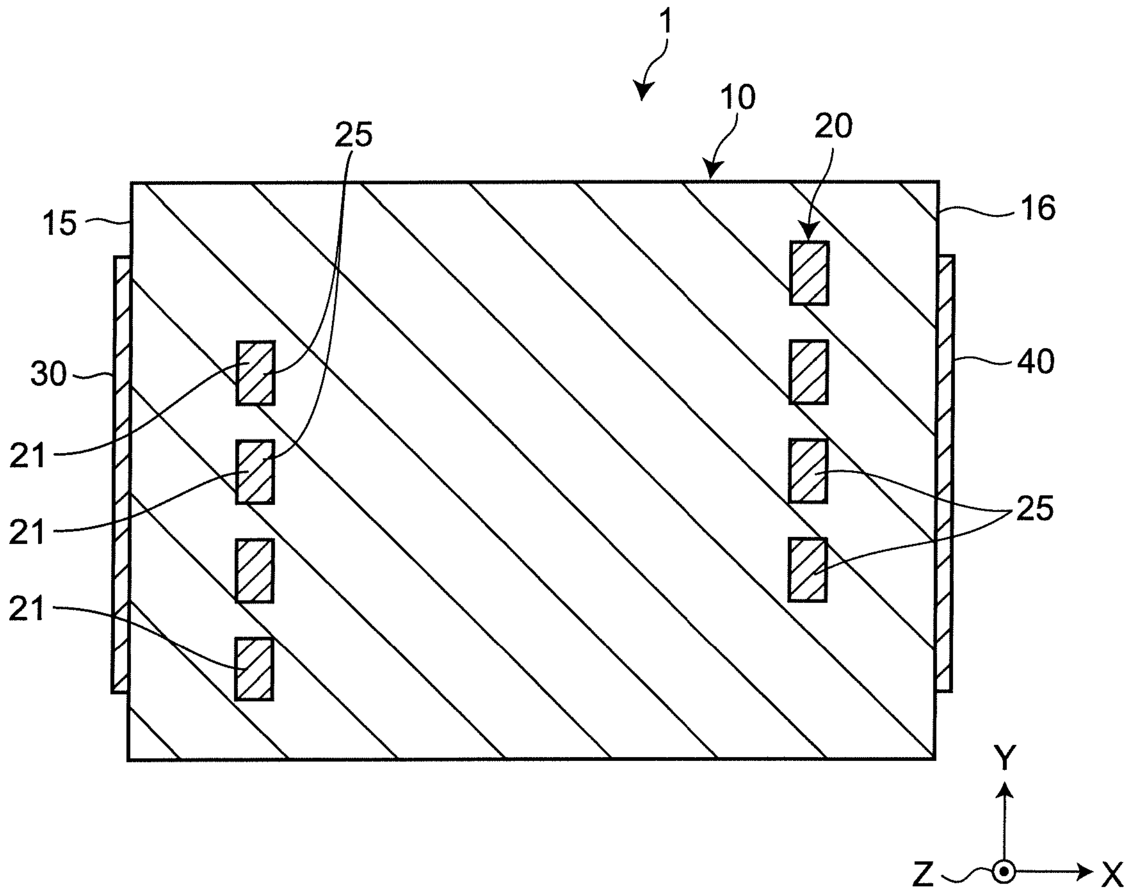
FIG. 3 is a cross-sectional view of the inductor component.

FIG. 1 is a transparent perspective view showing a first embodiment of an inductor component. FIG. 2 is an exploded perspective view of the inductor component. FIG. 3 is a cross-sectional view of the inductor component. As shown in FIGS. 1, 2, and 3, an inductor component 1 has an element body 10, a helical coil 20 disposed inside the element body 10, and a first external electrode 30 and a second external electrode 40 disposed on the element body 10 and electrically connected to the coil 20. In FIG. 1, the element body 10 is transparently drawn so that a structure can easily be understood. FIG. 3 shows a cross section taken along a line III-III of FIG. 1.

The inductor component 1 is electrically connected via the first and second external electrodes 30, 40 to a wiring of a circuit board not shown. The inductor component 1 is used as an impedance matching coil (matching coil) of a high-frequency circuit, for example, and is used for an electronic device such as a personal computer, a DVD player, a digital camera, a TV, a portable telephone, automotive electronics, and medical/industrial machinery. However, the inductor component 1 is not limited to these uses and is also usable for a tuning circuit, a filter circuit, and a rectifying/smoothing circuit, for example.

The element body 10 is formed into a substantially rectangular parallelepiped shape. The surface of the element body 10 has a first end surface 15, a second end surface 16 opposite to the first end surface 15, a bottom surface 17 connected between the first end surface 15 and the second end surface 16, and a top surface 18 opposite to the bottom surface 17. As shown in the figures, an X direction is a direction orthogonal to the first end surface 15 and the second end surface 16; a Y direction is a direction parallel to the first and second end surfaces 15, 16 and the bottom surface 17; and a Z direction is a direction orthogonal to the X direction and the Y direction and is a direction orthogonal to the bottom surface 17.

The element body 10 is formed by laminating a plurality of insulating layers 11. The lamination direction of the insulating layers 11 is a direction (Y direction) parallel to the first and second end surfaces 15, 16 and the bottom surface 17 of the element body 10. Therefore, the insulating layers 11 have a layered shape spreading in the XZ plane. As used herein, the term "parallel" is not limited to a strictly parallel relationship and includes a substantially parallel relationship in consideration of a realistic variation range. In the element body 10, an interface between the multiple insulating layers 11 may not be clear due to firing etc.

The insulating layer 11 contains a base material and a crystal, and a refractive index of each of the base material and the crystal is 1.8 or less for at least one wavelength of 350 nm or more and 450 nm or less (i.e., from 350 nm to 450 nm). In a method of measuring a refractive index of each of the base material and the crystal, the refractive index may be obtained from a composition analysis and a crystal structure analysis for each of the base material and the crystal.

The crystal has insulating properties and is quartz (crystal quartz), for example. The crystallinity of the quartz is not particularly limited. The base material is a solid having insulating properties. For example, the base material contains Si, is amorphous, and is preferably borosilicate glass containing B, Si, O, and K as main components. Other than borosilicate glass, glass may be those containing $SiO_2$, $B_2O_3$, $K_2O$, $Li_2O$, CaO, ZnO, $Bi_2O_3$, and/or $Al_2O_3$, for example, $SiO_2$—$B_2O_3$—$K_2O$-based glass, $SiO_2$—$B_2O_3$—$Li_2O$—CaO-based glass, $SiO_2$—$B_2O_3$—$Li_2O$—CaO—ZnO-based glass, or $Bi_2O_3$—$B_2O_3$—$SiO_2$—$Al_2O_3$-based glass. Two or more of these glass components may be combined. The base material may not be glass, may be another inorganic material, or may be an organic material such as a resin, and even in this case, the material is preferably amorphous. Furthermore, the inorganic material and the organic material may be combined.

The first external electrode 30 and the second external electrode 40 are made of a conductive material such as Ag or Cu and glass particles, for example. The first external electrode 30 has an L shape disposed over the first end surface 15 and the bottom surface 17. The second external electrode 40 has an L shape disposed over the second end surface 16 and the bottom surface 17.

The coil 20 is made of, for example, the same conductive material and glass particles as the first and second external electrodes 30, 40. The coil 20 is helically wound along the lamination direction of the insulating layers 11. A first end of the coil 20 is connected to the first external electrode 30, and a second end of the coil 20 is connected to the second external electrode 40. In this embodiment, the coil 20 and the first and second external electrodes 30, 40 are integrated without a clear boundary; however, the present disclosure is not limited thereto, and the coil and the external electrodes may be made of different materials or by different method so that a boundary may exist.

Although the coil 20 is formed in a substantially oval shape when viewed in an axial direction, the present disclosure is not limited to this shape. The shape of the coil 20 may be, for example, circular, elliptical, rectangular, another polygonal shape, etc. The axial direction of the coil 20 refers to the direction parallel to the central axis of the helix formed by winding the coil 20. The axial direction of the coil 20 and the lamination direction of the insulating layers 11 refer to the same direction.

The coil 20 includes coil wirings 21 wound along planes. A plurality of the coil wirings 21 is laminated along the axial direction. The coil wirings 21 are formed by being wound on principal surfaces (XZ planes) of the insulating layers 11 orthogonal to the axial direction. The coil wirings 21 adjacent to each other in the lamination direction are electrically connected in series through via wirings 26 penetrating the insulating layers 11 in a thickness direction (Y direction). The plurality of the coil wirings 21 is electrically connected to each other in series in this way to constitute a helix. Specifically, the coil 20 has a configuration in which the plurality of the coil wirings 21 electrically connected to each other in series and having the number of turns less than one is laminated, and the coil 20 has a helical shape. The coil wirings 21 are each made up of a single coil conductor layer 25.

Figure 4:
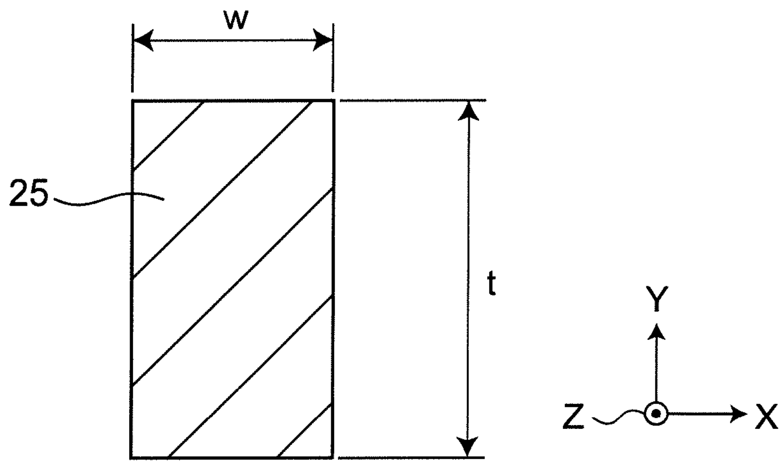
FIG. 4 is a cross-sectional view of a coil conductor layer.

As shown in FIG. 4, the aspect ratio of the coil conductor layer 25 is 1.0 or more. The aspect ratio of the coil conductor layer 25 is (thickness t of the coil conductor layer 25 in the axial direction)/(width w of the coil conductor layer 25). The width w of the coil conductor layer 25 refers to a width in a direction orthogonal to the axial direction of the coil 20 in a cross section orthogonal to the extending direction of the coil conductor layer 25. The thickness t of the coil conductor layer 25 is, for example, 50 μm, and the width w of the coil conductor layer 25 is, for example, 25 μm.

Although the cross section of the coil conductor layer 25 is rectangular in FIG. 4, the actual coil conductor layer 25 may not be rectangular. Even in this case, the aspect ratio of the coil conductor layer 25 can be calculated from the cross-sectional area of the coil conductor layer 25 and the maximum thickness of the coil conductor layer 25 in the axial direction. Specifically, the thickness t may be the maximum thickness of the coil conductor layer 25 in the axial direction, and the width w may be a value obtained by dividing the cross-sectional area of the coil conductor layer 25 by the maximum thickness of the coil conductor layer 25. As a result, even if unevenness is formed on an inner surface and an outer surface of the coil conductor layer 25, the aspect ratio can easily be obtained. As described above, the cross-sectional shape of the coil conductor layer 25 is not limited to a rectangular shape and includes an elliptical shape, a polygonal shape, shapes acquired by giving unevenness to these shapes, etc.

A method of manufacturing the inductor component 1 will be described.

First, a negative photosensitive insulating paste and conductive paste are prepared. The insulating paste includes a filler material (an example of the crystal) made of quartz, a glass material (an example of the base material) made of amorphous glass, and a resin material as a solvent containing these materials.

Figure 5A:
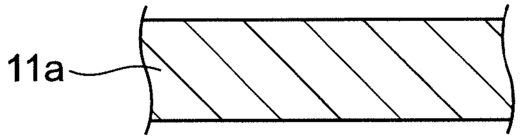
FIG. 5A is an explanatory view for explaining a method of manufacturing the inductor component.

As shown to FIG. 5A, the insulating paste is applied onto a base material such as a carrier film not shown to form an outer side insulating layer 11*a*. The insulating paste is applied to the outer insulating layer 11*a* to form a first insulating layer 11*b*. The insulating paste is applied by screen printing, for example. A mark layer 12 indicated by an imaginary line of FIG. 2 may be formed before the outer insulating layer 11*a* is formed. The mark layer 12 is a layer colored by mixing a filler into the insulating paste, for example.

Figure 5B:
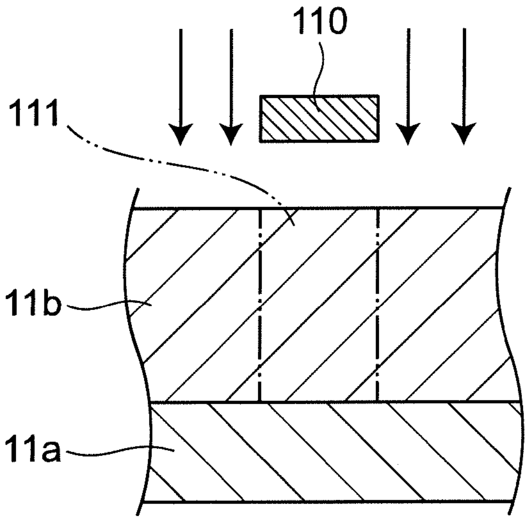
FIG. 5B is an explanatory view for explaining the method of manufacturing the inductor component.
Figure 5C:
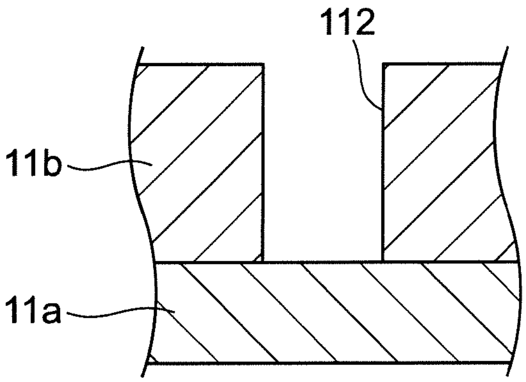
FIG. 5C is an explanatory view for explaining the method of manufacturing the inductor component.

As shown in FIG. 5B, the first insulating layer 11*b* is exposed while a first portion 111 (indicated by a dashed-two dotted line) of the first insulating layer 11*b* is shielded by a mask 110. A light source for the exposure may be a mercury lamp (g-line, i-line), LED, excimer laser, an EUV light source, X-ray, an electron beam, etc. and is preferably a light source with short wavelength and high straightness. As shown in FIG. 5C, the first portion 111 of the first insulating layer 11*b* is removed by development to form a groove 112 at a position corresponding to the first portion 111.

Figure 5D:
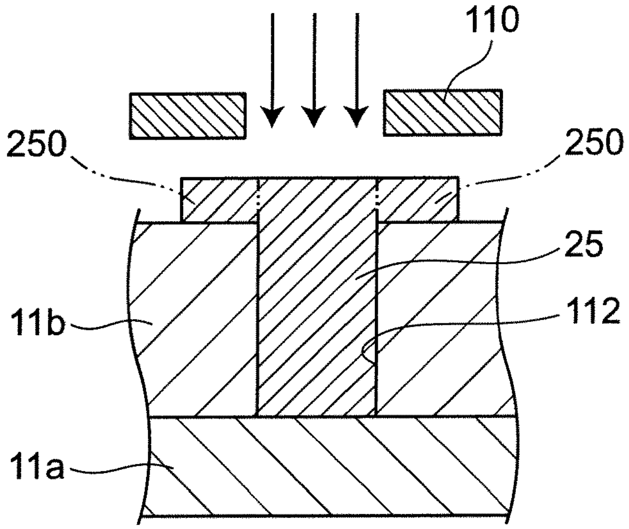
FIG. 5D is an explanatory view for explaining the method of manufacturing the inductor component.
Figure 5E:
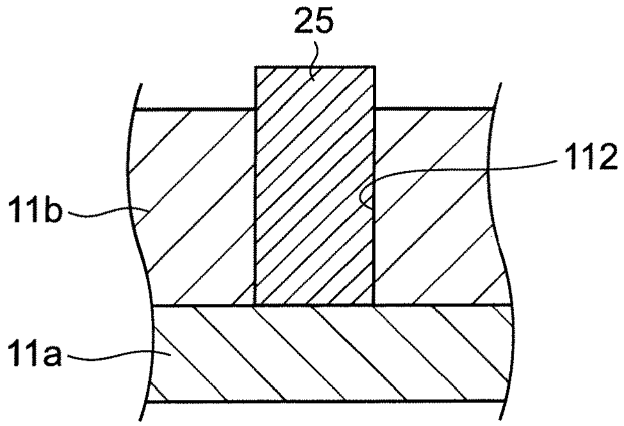
FIG. 5E is an explanatory view for explaining the method of manufacturing the inductor component.

As shown in FIG. 5D, the conductive paste is applied into the groove 112 to form the coil conductor layer 25 in the groove 112 as shown in FIG. 5E. Specifically, as shown in FIG. 5D, the photosensitive conductive paste is applied by screen printing on the first insulating layer 11*b* and in the groove 112. In this case, a width of an upper portion of the coil conductor layer 25 is formed larger than a width in the groove 112 of the coil conductor layer 25. The conductive paste in the groove 112 is then irradiated with ultraviolet light etc. through the mask 110 and developed with a developing solution such as an alkaline solution to remove an unexposed portion 250 of the coil conductor layer 25. As a result, as shown in FIG. 5E, the coil conductor layer 25 is formed in the groove 112.

Figure 5F:
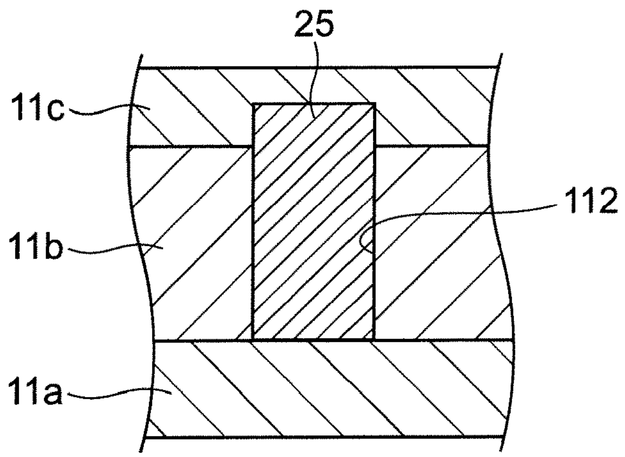
FIG. 5F is an explanatory view for explaining the method of manufacturing the inductor component.

As shown in FIG. 5F, the insulating paste is applied onto the first insulating layer 11*b* and the coil conductor layer 25 to form a second insulating layer 11*c*. The above steps are repeated multiple times to form a laminated body. After all the insulating layers are formed, the mark layer 12 indicated by the imaginary line of FIG. 2 may be formed to form a laminated body. Subsequently, firing is performed to manufacture the inductor component 1.

According to the inductor component 1, since the aspect ratio of the coil conductor layer 25 is 1.0 or more, the aspect ratio of the coil conductor layer 25 can be made larger, and this can provide an effect of reducing the electrical resistance at high frequency due to an increase in area of an inner surface of the coil wiring 21 (corresponding to a skin area of the coil 20 for high frequency signals).

Additionally, since the refractive index of each of the base material and the crystal is 1.8 or less at any wavelength of 350 nm or more to 450 nm or less (i.e., from 350 nm to 450 nm), the light used for exposure can be prevented from scattering in the first insulating layer 11*b* when the groove 112 is formed by exposure in the first insulating layer 11*b*. As a result, light can be applied to a deeper portion in the first insulating layer 11*b*, so that the aspect ratio of the coil conductor layer 25 can be made larger. Moreover, the coil conductor layer 25 can be prevented from deteriorating in rectangularity of a cross section due to light scattering at the time of exposure, so that a loss increase due to a reduction a reduction in the skin area can be prevented.

Therefore, the Q value can be increased by reducing a resistance loss due to a skin effect at high frequency.

Preferably, the aspect ratio of the coil conductor layer 25 is 1.0 or more and less than 2.0 (i.e., from 1.0 to 2.0). Therefore, by limiting the aspect ratio of the coil conductor layer 25 to a range up to 2.0 at which a sufficient curing depth can be obtained at the time of exposure, the coil conductor layer 25 can be prevented from deteriorating in rectangularity of a cross section due to an insufficient curing depth. As a result, a loss increase due to a reduction in the skin area can be prevented, and the Q value can be increased.

Preferably, in the cross section of the element body 10, an area ratio between the base material and the crystal is in a range of 75:25 to 50:50. In a method of obtaining the area ratio between the base material and the crystal, a region of 50 μm×100 μm is measured on a SEM image in a central portion of the XZ cross section at a central position in the Y direction of the element body 10.

As described above, when the area ratio of the crystal is set to 25% or more, development of a micro crack etc. can be suppressed, and sufficient mechanical strength can be obtained. When the area ratio of the crystal is set to 50% or less, an amount of the base material can be ensured, and insufficient densification due to a shortage of softened base material can be prevented so as to achieve sufficient densification. Therefore, an element body having sufficient densification and mechanical strength can be obtained.

Preferably, as indicated by the imaginary line of FIG. 2, the element body 10 includes the mark layer 12 on the outside of the insulating layer 11 in the lamination direction. The mark layer 12 contains an intra-mark-layer base material that contains Si and that is amorphous and an intra-mark-layer crystal. The intra-mark-layer crystal contains a metal oxide, and the refractive index of the metal oxide is 1.7 or more and 3.0 or less (i.e., from 1.7 to 3.0) for at least one wavelength of 450 nm or more and 750 nm or less (i.e., from 450 nm to 750 nm), and the absorption coefficient of the metal oxide is 0.3 or more for at least one wavelength of 250 nm or more and 350 nm or less (i.e., from 250 nm to 350 nm). The refractive index of the intra-mark-layer base material is 1.4 or more and 1.6 or less (i.e., from 1.4 to 1.6) for at least one wavelength of 450 nm or more and 750 nm or less (i.e., from 450 nm to 750 nm).

As described above, when the refractive index of the metal oxide is set to 1.7 or more and 3.0 or less (i.e., from 1.7 to 3.0), the Q value can be prevented from decreasing due to an increase in capacity components while shielding properties are obtained. When the absorption coefficient of the metal oxide is set to 0.3 or more, high resolution can be obtained by cutting low wavelength ultraviolet light having a large scattering cross section and easily causing deterioration (thickening) of an exposure shape due to scattering. Additionally, the base material can be shared between the mark layer 12 and the insulating layer 11, and the mark layer 12 can be formed simply by adding the crystal.

Preferably, the metal oxide contained in the intra-mark-layer crystal contains Ti, Nb, and Ce. As a result, desired light absorption characteristics can be obtained.

Preferably, the intra-mark-layer crystal of the mark layer 12 contain a pigment. By adding a pigment in this way, the mark layer 12 can be colored. Therefore, the mark layer 12 can be provided with visibility (distinguishability), and a detectability of an overturning failure can be improved in a mounting machine etc.

Preferably, the intra-mark-layer crystal of the mark layer 12 contains a metal oxide having a spinel type crystal structure containing Co. Therefore, the mark layer can be provided with visibility (distinguishability), and a detectability of an overturning failure can be improved in a mounting machine etc.

Second Embodiment

FIG. 5 is a cross-sectional view showing a second embodiment of the inductor component. The second embodiment is different from the first embodiment in configuration of coil wirings. This different configuration will hereinafter be described.

Figure 6:
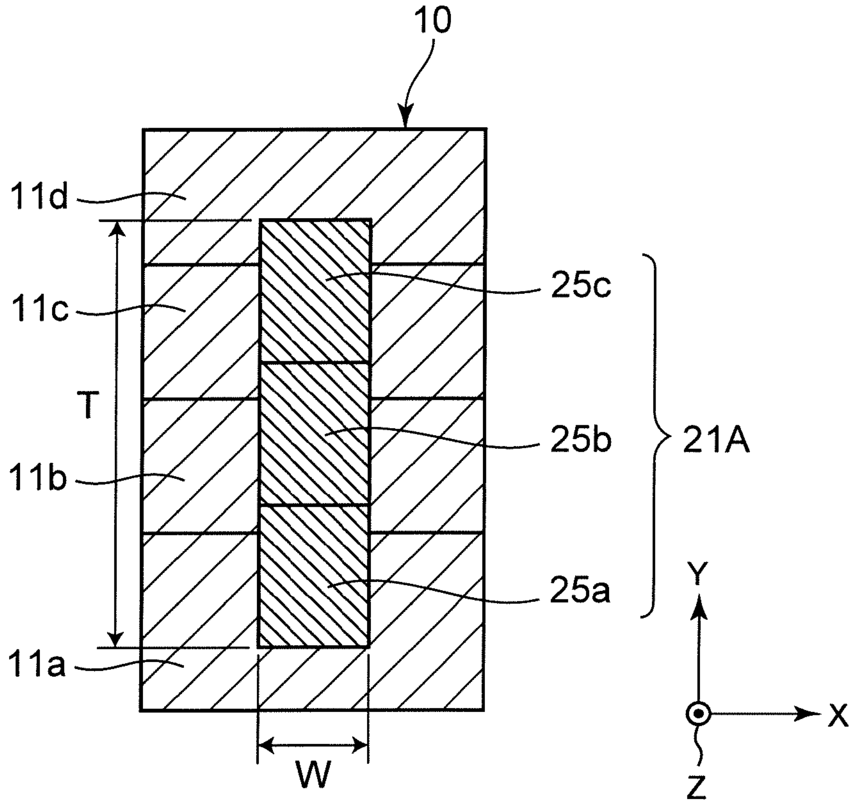
FIG. 6 is a schematic cross-sectional view showing a coil wiring of a second embodiment of the inductor component.

Although the coil wiring 21 of the first embodiment is made up of a single layer as shown in FIGS. 3 and 4, a coil wiring 21A of the second embodiment is made up of three coil conductor layers 25*a*, 25*b*, 25*c* laminated in surface contact with each other as shown in FIG. 6. The coil wiring 21A may be made up of two or four or more coil conductor layers.

Specifically, the coil wiring 21A is formed as multiple stages. For example, a first groove is formed in a first insulating layer 11*a*, and the first coil conductor layer 25*a* is embedded in the first groove. Subsequently, a second insulating layer 11*b* is formed on the first insulating layer 11*a*, a second groove is formed in the second insulating layer 11*b*, and the second coil conductor layer 25*b* is embedded in the second groove. Subsequently, a third insulating layer 11*c* is formed on the second insulating layer 11*b*, a third groove is formed in the third insulating layer 11*c*, the third coil conductor layer 25*c* is embedded in the third groove, and a fourth insulating layer 11*d* is formed on the third insulating layer 11*c*. As a result, the first to third coil conductor layers 25*a* to 25*c* are laminated in surface contact with each other to constitute the coil wiring 21A. The first to fourth insulating layers 11*a* to 11*d* are laminated to constitute a portion of the element body 10 and cover the coil wiring 21A. The coil conductor layers 25*a* to 25*c* can be formed by a photosensitive paste method in which application of a photosensitive conductive paste is followed by photo-curing of necessary portions for patterning. When the photosensitive conductive paste is applied, the paste is preferably applied by screen printing so as to improve a material usage rate. Alternatively, the coil conductor layers 25*a* to 25*c* may be formed by firing after applying a conductive paste by screen printing etc., or may be formed by a plating method, a sputtering method, etc.

Therefore, according to the configuration of this embodiment, even if it is difficult to form a coil wiring with a high aspect ratio in terms of process, the coil wiring 21A with a high aspect ratio and a high rectangularity can be formed by laminating a plurality of the coil conductor layers 25*a* to 25*c* to constitute the coil wiring 21A. In particular, since it is no longer necessary to increase the thickness per coil conductor layer for making the aspect ratio higher, the distortion of the cross-sectional shape due to insufficient curing depth of the photosensitive paste or photoresist can be reduced so as to form the coil wiring with the aspect ratio exceeding the limitation of the process.

Figure 7A:
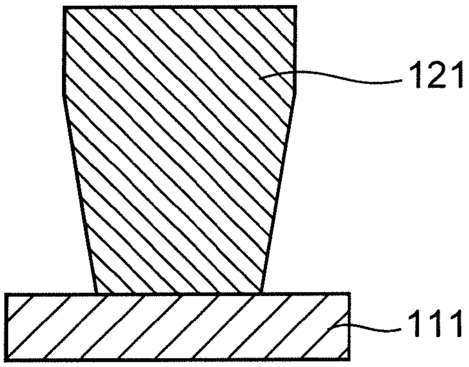
FIG. 7A is an explanatory view for explaining the case of single-stage formation of a coil wiring with a high aspect ratio by a photosensitive paste method.

On the other hand, FIG. 7A shows a shape of a coil wiring 121 in the case of single-stage formation of the coil wiring 121 with a high aspect ratio by a photosensitive paste method, for example. In the photosensitive paste method, a photosensitive conductive paste is applied onto an insulating layer 111, and the paste is then exposed to light in a portion forming the coil wiring 121 and, after an unexposed portion is removed, the coil wiring 121 is formed through sintering. However, if the aspect ratio is high, since the bottom side of the photosensitive conductive paste cannot sufficiently be photo-cured at the time of the exposure and a shrinkage rate becomes larger in a bottom portion than the upper side at the time of sintering, the wiring width of the coil wiring 121 becomes smaller on the bottom side as compared to the upper side, resulting in a distorted shape.

Figure 7B:
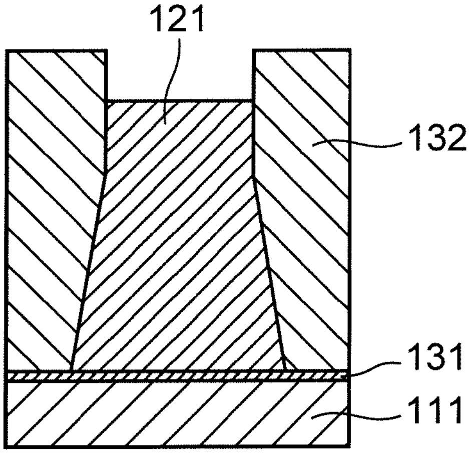
FIG. 7B is an explanatory view for explaining the case of single-stage formation of a coil wiring with a high aspect ratio by a semi-additive method.

FIG. 7B shows a shape of the coil wiring 121 in the case of single-stage formation of the coil wiring 121 with a high aspect ratio by a semi-additive method, for example. In the semi-additive method, a seed layer (intervening layer) 131 is formed on the insulating layer 111 by electroless plating, a photosensitive resist 132 is formed on the seed layer 131, and after the photosensitive resist 132 is removed by photolithography from the portion forming the coil wiring 121, the coil wiring 121 is formed in the removed portion by electrolytic plating using the seed layer 131. However, if the aspect ratio is high, since the bottom side of the photosensitive resist 132 cannot sufficiently be photo-cured at the time of photolithography of the photosensitive resist 132 and the bottom side is removed more than necessary during etching, the wiring width of the coil wiring 121 becomes larger on the bottom side as compared to the upper side, resulting in a distorted shape.

Such a problem of the shape of the coil wiring essentially occurs also in screen printing, other plating methods, a sputtering method, etc., and each process has a restriction on the aspect ratio for forming a coil wiring having a stable shape.

On the other hand, since the coil wiring 21A of this embodiment is formed as multiple stages, the coil conductor layers 25*a* to 25*c* are formed within a depth range having no influence on photo-curing depth in the grooves of the insulating layers 11*a* to 11*c*, so that the coil conductor layers 25*a* to 25*c* become rectangular. As a result, the current density distribution is stabilized at high frequency.

Additionally, since this embodiment eliminates an unexposed portion in the bottom portion of the coil wiring 21A in the photosensitive paste method, a void after firing is hardly generated due to a difference in shrinkage amount during firing.

In the structure of this embodiment, no intervening layer such as the seed layer 131 of FIG. 7B exists between the coil conductor layers 25*a*, 25*b*, 25*c* in surface contact and between the coil conductor layers 25*a*, 25*b*, 25*c* and the element body 10. Therefore, the adhesion strength of the coil wiring 121 does not deteriorate due to a difference in process between a portion formed by electroless plating (the seed layer 131) and a portion formed by electrolytic plating in the coil wiring, a difference in material between the coil wiring 121 and the insulating layer 111, etc. As a result, the adhesion strength can be prevented from deteriorating between the coil conductor layers 25*a* to 25*c* formed as multiple stages, and the adhesion strength can be prevented from deteriorating between the coil conductor layers 25*a* to 25*c* and the element body 10.

As shown in FIG. 6, the aspect ratio of the coil wiring 21A is 1.0 or more and less than 8.0 (i.e., from 1.0 to 8.0). The aspect ratio is (thickness t of the coil wiring 21A)/(wiring width W of the coil wiring 21A). Although the cross section of the coil wiring 21A is rectangular in FIG. 6, the actual coil wiring 21A may not be rectangular. Even in this case, the aspect ratio of the coil wiring 21A can be calculated from the cross-sectional area of the coil wiring 21A and the maximum thickness of the coil wiring 21A in the axial direction. Specifically, the thickness t may be the maximum thickness of the coil wiring 21A in the axial direction, and the wiring width W may be a value obtained by dividing the cross-sectional area of the coil wiring 21A by the maximum thickness of the coil wiring 21A. As a result, even if unevenness is formed on the inner surface and the outer surface of the coil wiring 21A, the aspect ratio can easily be obtained.

Since the aspect ratio of the coil wiring 21A is 1.0 or more, the effect of reducing an electric resistance at high frequency can be acquired due to an increase in the area of the inner surface of the coil wiring 21A (corresponding to a skin area of the coil 20 for a high frequency signal) and, since the aspect ratio is less than 8.0, the effect of increasing an electric resistance due to a decrease in the cross-sectional area of the coil wiring 21A can be suppressed. This leads to a high acquisition efficiency of the Q value with respect to the L value, so that the Q value can consequently be improved. This will hereinafter be described in detail.

Figure 8:
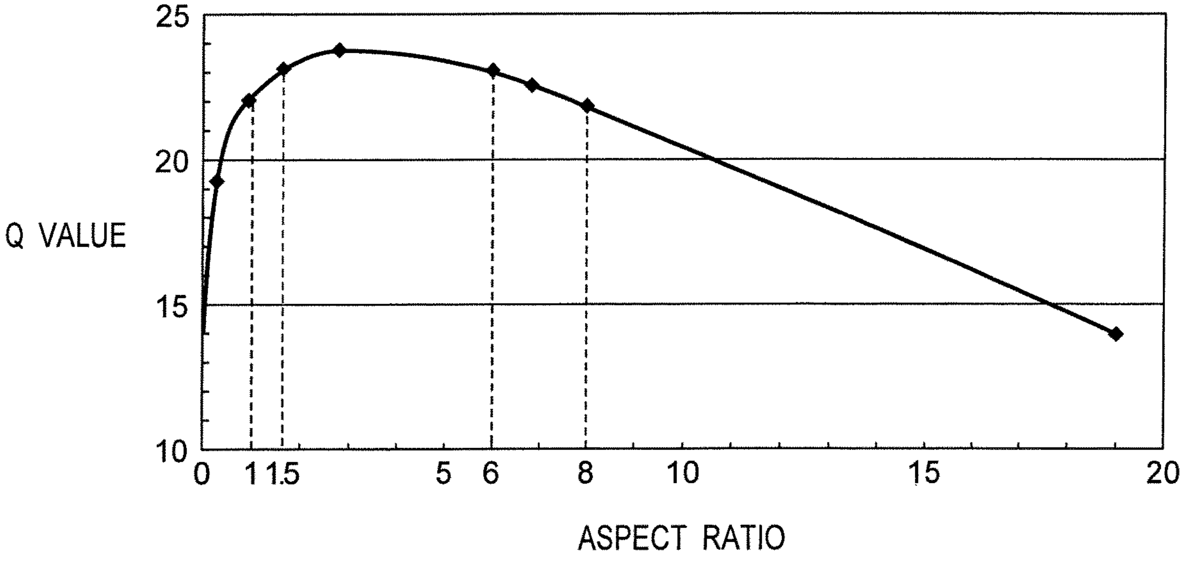
FIG. 8 is a graph of a relationship between the aspect ratio of the coil wiring and the Q value of the inductor component

FIG. 8 shows a relationship between the aspect ratio of the coil wiring and the Q value of the inductor component. The horizontal axis of the graph of FIG. 8 indicates the aspect ratio of the coil wiring, and the vertical axis indicates the Q value of the inductor component. The graph of FIG. 8 shows the Q value of the inductor component acquired when the aspect ratio of the coil wiring is changed in a simulation. In the simulation, the aspect ratio is changed with the L value of the inductor component and the outer diameter of the coil kept constant. In other words, although an infinite number of combinations exists between the thicknesses and the wiring width of the coil wiring having the same aspect ratio, the thickness (the length of the coil in the axial direction) and the wiring width (the coil inner diameter) of the coil wiring are set among them such that the predetermined L value and outer diameter are achieved. The graph of FIG. 8 shows a state of the inductor component having a chip size of 0402 size (the mounting surface is 0.4 mm×0.2 mm) and the L value of 1.5 nH when the input signal to the inductor component has the signal frequency of 1 GHz. The outer diameter of the coil is a value obtained from the area surrounded by the outer circumferential surface 20*a* when the coil is viewed in the axial direction, and is twice as large as the square root (theoretical radius) of the value acquired by dividing the area by the circular constant.

As shown in FIG. 8, the Q value of the inductor component has a convex curve shape with respect to the aspect ratio, and it can be seen that a high Q value can be acquired when the aspect ratio is 1.0 or more and less than 8.0 (i.e., from 1.0 to 8.0). It can also be seen that a higher Q value can be acquired when the aspect ratio is 1.5 or more and less than 6.0 (i.e., from 1.5 to 6.0).

As a result of extensive studies, the present inventors derived the relationship between the aspect ratio and the Q value shown in FIG. 8 and found that the graph of the aspect ratio and the Q value has a peak value. The reason is that the effect of reducing the electric resistance at high frequencies due to an increase in the skin area of the coil is dominant from the aspect ratio of 0 to the peak value, and the Q value increases. On the other hand, in the range of the aspect ratio exceeding the peak value, the effect of increasing the electric resistance of the coil wiring due to a decrease in the cross-sectional area of the coil wiring becomes dominant, and the Q value decreases. In contrast, in the conventional example (Japanese Laid-Open Patent Publication No. 2014-107513), the aspect ratio is smaller than 1.0, and it can be seen from FIG. 8 that the Q value is very low.

As shown in FIG. 6, the width W of the coil wiring 21A is preferably 20 μm or more. In particular, since the groove width of the insulating layers 11*a*, 11*b*, 11*c* is 20 μm or more, when the conductive paste used as the material of the coil wiring 21A is filled in the groove, the paste can be filled without entrapment of air bubbles. Therefore, the high aspect wiring 21A can stably be formed.

Third Embodiment

Figure 9:
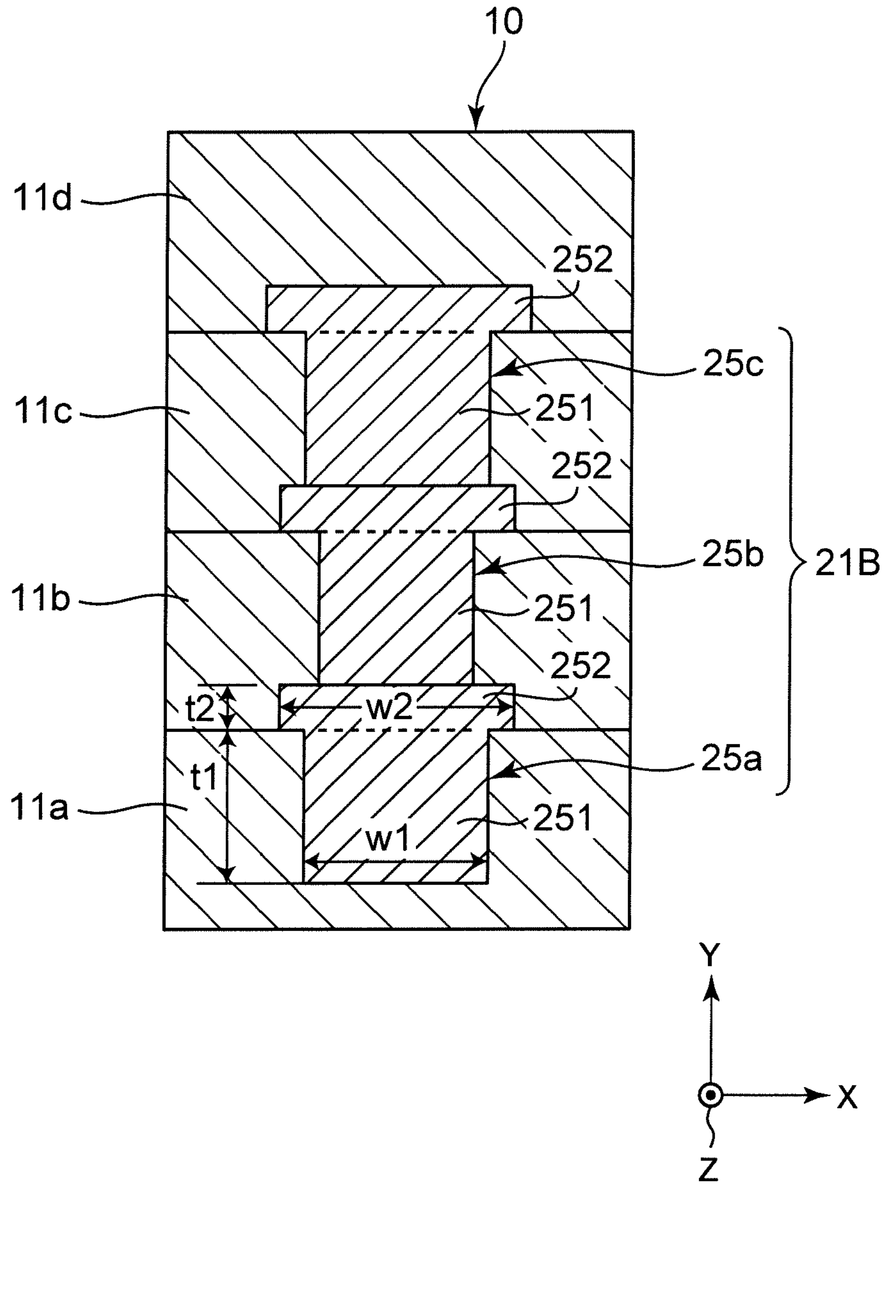
FIG. 9 is a schematic cross-sectional view showing a coil wiring of a third embodiment of the inductor component.

FIG. 9 is a cross-sectional view showing a third embodiment of the inductor component. The third embodiment is different from the second embodiment in configuration of the coil wiring. This different configuration will hereinafter be described.

Although the coil wiring 21A of the second embodiment is made up of the coil conductor layers 25*a*, 25*b*, 25*c* having a rectangular cross section as shown in FIG. 6, a coil wiring 21B of the third embodiment is made up of the coil conductor layers 25*a*, 25*b*, 25*c* having a T-shaped cross section, and the cross section of the coil wiring 21B has a stacked shape of T.

In this case, although the cross section of the coil wiring 21B is T-shaped, the aspect ratio of the coil wiring 21B can be calculated from the cross-sectional area of the coil wiring 21B and the maximum thickness of the coil wiring 21B in the axial direction. Specifically, the aspect ratio is (thickness t of the coil wiring 21B)/(wiring width W of the coil wiring 21B), where the thickness T may be the maximum thickness of the coil wiring 21B in the axial direction, and the wiring width W may be a value obtained by dividing the cross-sectional area of the coil wiring 21B by the maximum thickness of the coil wiring 21B. As a result, the aspect ratio can be obtained.

As shown in FIG. 9, each of the coil conductor layers 25*a*, 25*b*, 25*c* includes a body portion 251 and a head portion 252 connected to the body portion 251. The head portion 252 is located on the upper side of the body portion 251 in the lamination direction. A width w2 of the head portion 252 is wider than a width w1 of the body portion 251. A thickness t2 of the head portion 252 is smaller than a thickness t1 of the body portion 251 portion. The thickness t2 of the head portion 252 is preferably equal to or less than 30% of an overall thickness.

A proportion of the difference between the maximum width and the minimum width of the coil wiring 21B to the maximum width of the coil wiring 21B is preferably 20% or less. Specifically, the maximum width of the coil wiring 21B is the width w2 of the head portion 252, and the minimum width of the coil wiring 21B is the width w1 of the body portion 251. Therefore, (w2−w1)/w2 is 20% or less. As a result, by increasing the rectangularity of the cross section of the coil wiring 21B, the skin area can be expanded at high frequency, and the loss can be reduced, so that the Q value can be increased.

A proportion of the difference between the maximum width and the minimum width of the body portion 251 to the maximum width of the body portion 251 is preferably 10% or less. Specifically, the cross section of the body portion 251 does not have a complete rectangular shape and includes an elliptical shape, a polygonal shape, and shapes acquired by giving unevenness to these shapes. Therefore, the body portion 251 includes a maximum width and a minimum width. As a result, by increasing the rectangularity of the cross section of the coil wiring 21B, the skin area can be expanded at high frequency, and the loss can be reduced, so that the Q value can be increased. In this case, a proportion of the difference between the maximum width of the head portion 252 and the minimum width of the body portion 251 to the maximum width of the body portion 251 is greater than 10%.

Figure 10A:
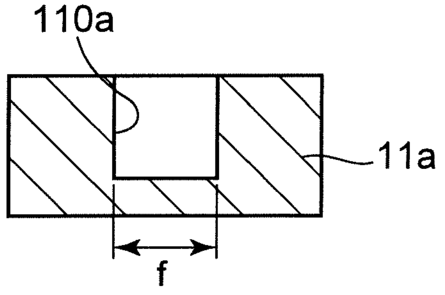
FIG. 10A is an explanatory view for explaining a method of forming a coil conductor layer such that the coil conductor layer has a width made larger than a width of a groove of an insulating layer.
Figure 10B:
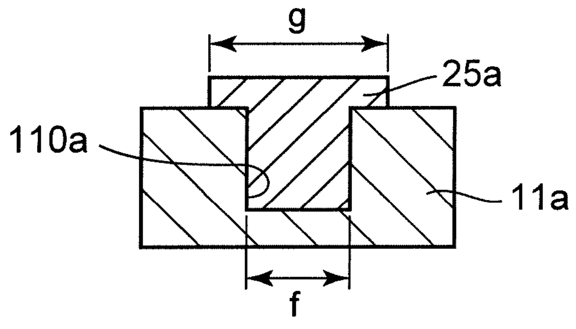
FIG. 10B is an explanatory view for explaining the method of forming a coil conductor layer such that the coil conductor layer has a width made larger than a width of a groove of an insulating layer.

Description will hereinafter specifically be made with reference to FIGS. 10A to 10D corresponding to a transverse cross section of the coil wiring. As shown in FIG. 10A, a first groove 110*a* is formed in the first insulating layer 11*a* by a photolithography step etc. In FIG. 10A, the depth of the first groove 110*a* is smaller than the thickness of the first insulating layer 11*a*, and this can be achieved by, for example, a photolithographic method using a halftone mask, or a known method such as forming the first insulating layer 11*a* made up of two layers. The first groove 110*a* may be formed to a depth penetrating the first insulating layer 11*a*. Subsequently, as shown in FIG. 10B, a photosensitive conductive paste is applied onto the first insulating layer 11*a* and into the first groove 110*a* by screen printing to form a photosensitive conductive paste layer. The photosensitive conductive paste layer is then irradiated with ultraviolet light etc. through a photomask and developed with a developing solution such as an alkaline solution. As a result, the first coil conductor layer 25*a* is formed on the first insulating layer 11*a* and in the first groove 110*a*. At this step, a wiring width g of the first coil conductor layer 25a is made larger than a width f of the first groove 110a by using the pattern design of the photomask.

Figure 10C:
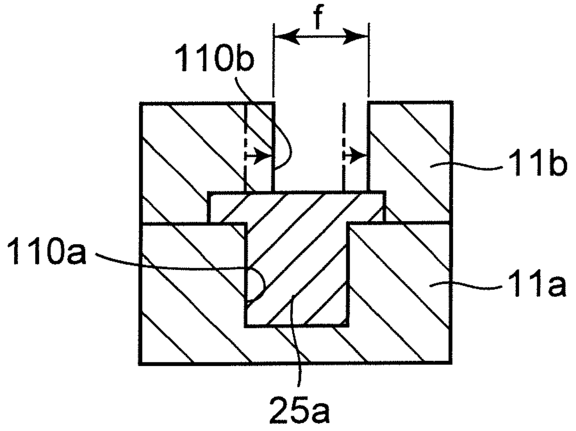
FIG. 10C is an explanatory view for explaining the method of forming a coil conductor layer such that the coil conductor layer has a width made larger than a width of a groove of an insulating layer.

Subsequently, as shown in FIG. 10C, a second insulating layer 11b is formed on the first insulating layer 11a. A second groove 110b is then formed in the second insulating layer 11b by a photolithography step etc. It is assumed that the second groove 110b is formed at a position deviated from the correct position indicated by imaginary lines due to misalignment etc. of a mask at the photolithography step.

Figure 10D:
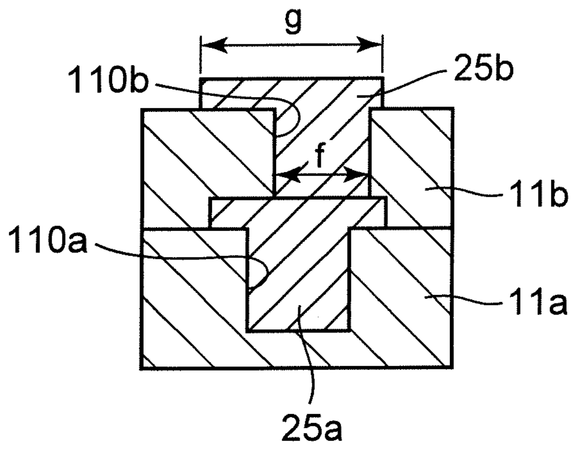
FIG. 10D is an explanatory view for explaining the method of forming a coil conductor layer such that the coil conductor layer has a width made larger than a width of a groove of an insulating layer.

Subsequently, as shown in FIG. 10D, a photosensitive conductive paste is applied onto the second insulating layer 11b and into the second groove 110b by screen printing to form a photosensitive conductive paste layer. The photosensitive conductive paste layer is then irradiated with ultraviolet light etc. through a photomask and developed with a developing solution such as an alkaline solution. As a result, the second coil conductor layer 25b is formed on the second insulating layer 11b and in the second groove 110b. In this case, even though the second groove 110b is formed at a deviated position, the wiring width g of the second coil conductor layer 25b is larger than the width f of the second groove 110b and, therefore, the second coil conductor layer 25b is filled into the second groove 110b.

Figure 11A:
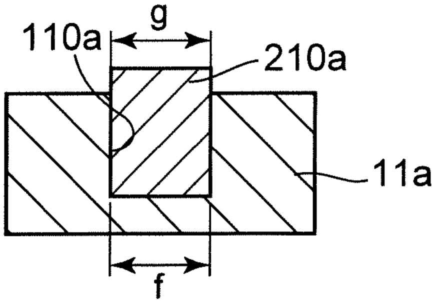
FIG. 11A is an explanatory view for explaining a method of forming a coil conductor layer such that the coil conductor layer has a width made equal to a width of a groove of an insulating layer.

On the other hand, the case of forming the width f of the grooves formed in the insulating layer and the wiring width g of the coil conductor layers as the same width, i.e., the case of making the width f of the first and second grooves 110a, 110b equal to the wiring width g of coil conductor layers 210a, 210b, will be described with reference to FIGS. 11A to 11D also corresponding to the transverse cross section of the coil wiring. First, as shown in FIG. 11A, the first groove 110a is formed in the first insulating layer 11a, and a photosensitive conductive paste is applied into the first groove 110a by screen printing to form a photosensitive conductive paste layer. The photosensitive conductive paste layer is then irradiated with ultraviolet light etc. through a photomask and developed with a developing solution such as an alkaline solution. In this way, when the formation position of the first groove 110a coincides with the formation position of the first coil conductor layer, the first coil conductor layer 210a is formed in the first groove 110a.

Figure 11B:
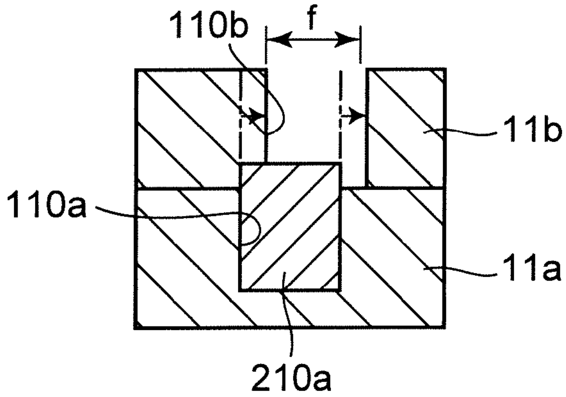
FIG. 11B is an explanatory view for explaining the method of forming a coil conductor layer such that the coil conductor layer has a width made equal to a width of a groove of an insulating layer.

Subsequently, as shown in FIG. 11B, the second insulating layer 11b is formed on the first insulating layer 11a. The second groove 110b is then formed in the second insulating layer 11b by a photolithography step etc. It is assumed that the second groove 110b is formed at a position deviated from the correct position indicated by imaginary lines due to misalignment etc. of a mask at the photolithography step.

Figure 11C:
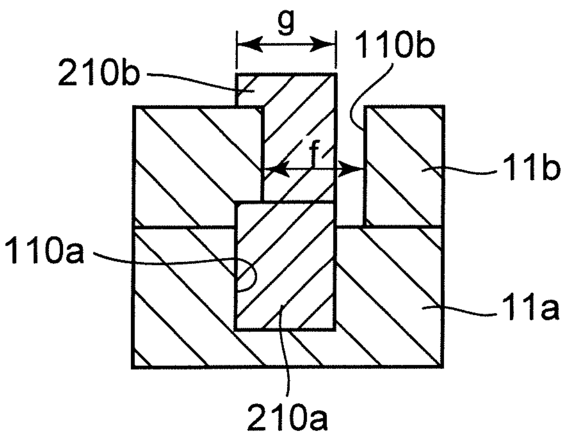
FIG. 11C is an explanatory view for explaining the method of forming a coil conductor layer such that the coil conductor layer has a width made equal to a width of a groove of an insulating layer.
Figure 11D:
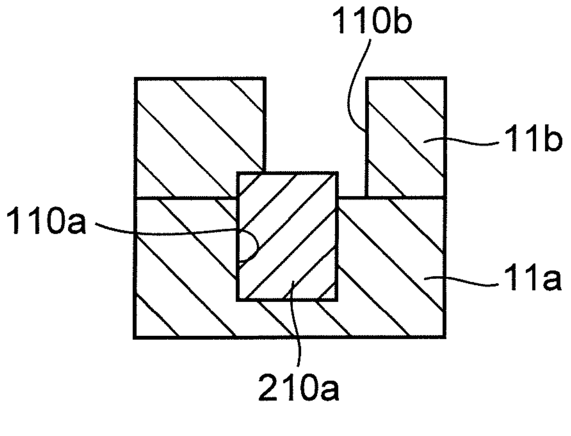
FIG. 11D is an explanatory view for explaining the method of forming a coil conductor layer such that the coil conductor layer has a width made equal to a width of a groove of an insulating layer.

Subsequently, as shown in FIG. 11C, a photosensitive conductive paste is applied onto the second insulating layer 11b and into the second groove 110b by screen printing to form a photosensitive conductive paste layer. The photosensitive conductive paste layer is then irradiated with ultraviolet light etc. through a photomask and developed with a developing solution such as an alkaline solution to form the second coil conductor layer 210b. In this case, if the second groove 110b is formed at the deviated position, the photosensitive conductive paste layer is not filled into the second groove 110b because the width f of the second groove 110b is the same as the width g of the second coil conductor layer 210b. In particular, since the second groove 110 b is deviated from the position of application by screen printing, a gap is formed between the photosensitive conductive paste layer to be the second coil conductor layer 210b and the second groove 110b. As a result, at the photolithography step for the photosensitive conductive paste layer, the developing solution enters from the gap of the second groove 110b. The lower layer side of the photosensitive conductive paste layer is less photo-cured as compared to the upper layer side and therefore may possibly be removed by the developing solution and, in this case, as shown in FIG. 11D, the second coil conductor layer 210b may peel from the second groove 110b.

It is noted that if the formation position of the second groove 110b is deviated as shown in FIG. 11B, the photosensitive conductive paste layer can be filled into the second groove 110b by giving a margin to the shape of application of the photosensitive conductive paste by screen printing at the time of formation of the second coil conductor layer 210b. However, even in this case, since the exposure position of the photosensitive conductive paste at the photolithography step is deviated from the formation position of the second groove 110b, a portion of the photosensitive conductive paste layer filled in the second groove 110b is not photo-cured and is removed by development, so that a gap is formed in the second groove 110b. Therefore, as shown in FIG. 11D, the second coil conductor layer 210b may peel from the second groove 110b due to the developing solution.

Furthermore, although the case of deviation of the formation position of the second groove 110b has been described above, even when the formation position of the second groove 110b is not deviated, the same problem may occur at the time of formation of the second coil conductor layer 210b due to a deviation of the mask of the screen printing or a deviation of the photomask of the photolithography step. Therefore, the transverse cross section of the coil wiring 21B preferably has a stacked shape of T, so that the coil wiring 21B with a high aspect ratio can stably be formed.

The present disclosure is not limited to the embodiments described above and can be changed in design without departing from the spirit of the present disclosure. For example, respective feature points of the first to third embodiments may variously be combined.

In the first to third embodiments, the base material of the insulating layer may be made of a ceramic material mainly composed of ferrite or a resin material mainly composed of polyimide etc.

In the first embodiment, the coil wiring is made up of a single rectangular coil conductor layer; however, the coil wiring may be made up of a single T-shaped coil conductor layer (of the second embodiment).

Example

An example of the method of manufacturing the inductor component will hereinafter be described.

An insulating layer is formed by repeatedly applying an insulating paste containing quartz as a filler and mainly composed of borosilicate glass by screen printing. This insulating layer serves as an outer-layer insulating layer located on one outer side in the axial direction of the coil.

A photosensitive conductive paste layer is applied and formed by a photolithography step to form a coil conductor layer and an external electrode conductor layer. Specifically, the photosensitive conductive paste containing Ag as a main metal component is applied onto the insulating layer by screen printing to form the photosensitive conductive paste layer. The photosensitive conductive paste layer is then irradiated with ultraviolet light etc. through a photomask and developed with an alkaline solution etc. As a result, the coil conductor layer and the external electrode conductor layer are formed on the insulating layer. At this step, a desired coil pattern can be drawn on the photomask.

An insulating layer provided with an opening and a via hole is formed by a photolithography step. Specifically, a photosensitive insulating paste is applied by screen printing to form a layer on the insulating layer. The photosensitive conductive paste layer is then irradiated with ultraviolet light etc. through a photomask and developed with an alkaline solution etc.

A coil conductor layer and an external electrode conductor layer are formed by a photolithography step. Specifically, a photosensitive conductive paste containing Ag as a main metal component is applied by screen printing to form a photosensitive conductive paste layer. The photosensitive conductive paste layer is then irradiated with ultraviolet light etc. through a photomask and developed with an alkaline solution etc. As a result, a conductor layer connecting between the external electrode conductor layers is formed in the opening, a via hole conductor is formed in the via hole, and a coil conductor layer is formed on the insulating layer and in the opening.

The step described above is repeated to form a coil conductor layer and an external electrode conductor layer on and in the insulating layer.

The insulating paste is repeatedly applied by screen printing to form an insulating layer. This insulating layer is an outer-layer insulating layer located on the other outer side in the axial direction of the coil.

Through the steps described above, a mother laminated body is acquired. Before forming the one outer-layer insulating layer and after forming the other outer-layer insulating layer, the mark layer 12 indicated by the imaginary line of FIG. 2 may be formed.

The mother laminated body is cut into multiple unfired laminated bodies by dicing etc. At the step of cutting the mother laminated body, the external electrodes are exposed from the laminated bodies on cut surfaces formed by cutting.

The unfired laminated bodies are fired under predetermined conditions to acquire laminated bodies. These laminated bodies are subjected to barrel finishing. Portions of the external electrodes exposed from the laminated bodies are subjected to Ni plating having a thickness of 2 μm to 10 μm and Sn plating having a thickness of 2 μm to 10 μm. Through the steps described above, inductor components of 0.4 mm×0.2 mm×0.2 mm are completed.

The method of forming the conductor pattern is not limited to the above method and may be, for example, a printing lamination method of a conductor paste using a screen printing plate opened in a conductor pattern shape, may be a method using etching for forming a pattern of a conductor film formed by a sputtering method, a vapor deposition method, pressure bonding of a foil, etc., or may be a method in which formation of a negative pattern is followed by formation of a conductor pattern with a plating film and subsequent removal of unnecessary portions as in a semi-additive method. Furthermore, by forming a conductor pattern as multiple stages to achieve a high aspect ratio, a loss due to resistance at high frequency can be reduced. More specifically, this may be a process of repeating the formation of the conductor pattern, may be a process of repeatedly laminating wirings formed by a semi-additive process, may be a process of forming a portion of lamination by a semi-additive process and forming the other portion by etching from a film grown by plating, or may be implemented by combining a process in which a wiring formed by a semi-additive process is of further grown by plating to achieve a higher aspect ratio.

The conductive material is not limited to the Ag paste as described above and may be a good conductor such as Ag, Cu, and Au formed by a sputtering method, a vapor deposition method, pressure bonding of a foil, etc.

The method of forming the insulating layers as well as the openings and the via holes is not limited to the above method and may be a method in which after pressure bonding, spin coating, or spray application of an insulating material sheet, the sheet is opened by laser or drilling.

The insulating material is not limited to the grass and ceramic materials as described above and may be an organic material such as an epoxy resin, a fluororesin, and a polymer resin, or may be a composite material such as a glass epoxy resin although a material low in dielectric constant and dielectric loss is desirable.

The size of the inductor component is not limited to the above description.

The method of forming the external electrodes is not limited to the method of applying plating to the electrode conductor exposed by cutting and may be a method including further forming conductor electrodes by dipping of a conductor paste, a sputtering method, etc. after cutting and then applying plating thereto.

What is claimed is:

1. An inductor component comprising:

an element body formed by laminating a plurality of insulating layers; and a helically wound coil disposed in the element body, wherein each of the insulating layers contains a base material and a crystal, wherein a refractive index of each of the base material and the crystal is 1.8 or less for at least one wavelength of from 350 nm to 450 nm, the coil includes a coil wiring wound along a plane, the coil wiring is made up of a plurality of coil conductor layers laminated in surface contact with each other, a thickness of the coil conductor layer extends along a winding axis direction, a width of the coil conductor layer extends transverse to the winding axis direction, and an aspect ratio of the coil conductor layer is the thickness divided by the width and is 1.0 or more, a cross section of each of the plurality of coil conductor layers is T-shaped, and wherein a cross section of the coil wiring has a stacked shape of T, and a wide part of one T-shaped coil conductor layer and a narrow part of another T-shaped coil conductor layer adjacent to the one T-shaped coil conductor layer are within a single insulating layer, and the narrow part of each of the plurality of coil conductor layers are aligned with respect to a direction transverse to the winding axis direction.

2. The inductor component according to claim 1, wherein the aspect ratio of the coil conductor layer is from 1.0 to 2.0.

3. The inductor component according to claim 1, wherein the aspect ratio of the coil wiring is from 1.0 to 8.0.

4. The inductor component according to claim 3, wherein the aspect ratio of the coil wiring is from 1.5 to 6.0.

5. The inductor component according to claim 3, wherein a width of the coil wiring is 20 μm or more.

6. The inductor component according to claim 1, wherein a width of the coil wiring is 20 μm or more.

7. The inductor component according to claim 1, wherein a proportion of a difference between a maximum width and a minimum width of the coil wiring to the maximum width of the coil wiring is 20% or less.

8. The inductor component according to claim 7, wherein the coil conductor layer is made up of a body portion and a head portion having a width greater than a width of the body portion, and
a proportion of a difference between the maximum width and the minimum width of the body portion to the maximum width of the body portion is 10% or less.

9. The inductor component according to claim 1, wherein the base material contains Si and is amorphous.

10. The inductor component according to claim 1, wherein the crystal is quartz.

11. The inductor component according to claim 1, wherein the base material is an amorphous glass containing B, Si, O, and K as main components.

12. The inductor component according to claim 1, wherein in a cross section of the element body, an area ratio between the base material and the crystal is in a range of 75:25 to 50:50.

13. The inductor component according to claim 1, wherein
the element body includes a mark layer on the outside of the insulating layer in a lamination direction,
the mark layer contains an intra-mark-layer base material that contains Si and that is amorphous and an intra-mark-layer crystal,
the mark layer contains a metal oxide, the refractive index of the metal oxide is from 1.7 to 3.0 for at least one wavelength of from 450 nm to 750 nm, the absorption coefficient of the metal oxide is 0.3 or more for at least one wavelength of from 250 nm to 350 nm, and
the refractive index of the intra-mark-layer base material is from 1.4 to 1.6 for at least one wavelength of from 450 nm to 750 nm.

14. The inductor component according to claim 13, wherein the intra-mark-layer crystal contains a pigment.

15. The inductor component according to claim 13, wherein the intra-mark-layer crystal contains a metal oxide having a spinel type crystal structure containing Co.

16. The inductor component according to claim 1, wherein
the element body includes a mark layer on the outside of the insulating layer in a lamination direction,
the mark layer contains an intra-mark-layer base material that contains Si and that is amorphous and an intra-mark-layer crystal that contains metal oxide, and
the metal oxide contained in the intra-mark-layer crystal contains at least one of Ti, Nb, or Ce.

17. The inductor component according to claim 1, wherein
the coil conductor layers have the same T shape with the narrow part in the center of the wide part.

18. An inductor component comprising:
an element body formed by laminating a plurality of insulating layers; and
a helically wound coil disposed in the element body, wherein
each of the insulating layers contains a base material and a crystal,
wherein
a refractive index of each of the base material and the crystal is 1.8 or less for at least one wavelength of from 350 nm to 450 nm,
the coil includes a coil wiring wound along a plane, the coil wiring is made up of one coil conductor layer or a plurality of coil conductor layers laminated in surface contact with each other, and an aspect ratio of the coil conductor layer is 1.0 or more,
the element body includes a mark layer on the outside of the insulating layer in a lamination direction,
the mark layer contains an intra-mark-layer base material that contains Si and that is amorphous and an intra-mark-layer crystal that contains metal oxide, and
the metal oxide contained in the intra-mark-layer crystal contains Ti, Nb, and Ce.

* * * * *